(12) United States Patent
Chen et al.

(10) Patent No.: US 8,792,655 B2
(45) Date of Patent: Jul. 29, 2014

(54) APPARATUS FOR DETECTING THE APPROACH DISTANCE OF A HUMAN BODY AND PERFORMING DIFFERENT ACTIONS ACCORDING TO THE DETECTING RESULTS

(76) Inventors: Wen-Chun Chen, Taipei (TW); Lan-Chung Hou, Taipei County (TW)

( * ) Notice: Subject to any disclaimer, the term of this patent is extended or adjusted under 35 U.S.C. 154(b) by 678 days.

(21) Appl. No.: 12/897,861

(22) Filed: Oct. 5, 2010

(65) Prior Publication Data

US 2011/0085680 A1 Apr. 14, 2011

(30) Foreign Application Priority Data

Oct. 5, 2009 (TW) .............................. 98218326 U

(51) Int. Cl.
| | |
|---|---|
| *H03G 3/00* | (2006.01) |
| *G08B 3/10* | (2006.01) |
| *G06Q 30/02* | (2012.01) |
| *G09F 25/00* | (2006.01) |
| *H03G 3/32* | (2006.01) |
| *G09F 27/00* | (2006.01) |

(52) U.S. Cl.
CPC *G08B 3/10* (2013.01); *G06Q 30/02* (2013.01); *G09F 25/00* (2013.01); *H03G 3/32* (2013.01); *G09F 2027/001* (2013.01)
USPC ....................................................... 381/107

(58) Field of Classification Search
CPC ..... H04M 2250/12; H04M 1/605; H03G 3/00
USPC .......... 700/94; 381/107, 104, 105; 250/336.1, 250/214 AL, 221, 342; 340/541, 686.6; 382/103
See application file for complete search history.

(56) References Cited

U.S. PATENT DOCUMENTS

| | | | | |
|---|---|---|---|---|
| 5,684,294 | A * | 11/1997 | Kouhi | 250/214 AL |
| 5,844,240 | A * | 12/1998 | Lee et al. | 250/342 |
| 6,597,407 | B1 * | 7/2003 | Taketani et al. | 348/625 |
| 7,130,705 | B2 * | 10/2006 | Amir et al. | 700/94 |
| 7,633,076 | B2 * | 12/2009 | Huppi et al. | 250/559.36 |
| 7,936,885 | B2 * | 5/2011 | Frank et al. | 381/57 |
| 8,280,540 | B2 * | 10/2012 | Hsu et al. | 700/94 |
| 2001/0012792 | A1 * | 8/2001 | Murray | 455/567 |
| 2003/0182000 | A1 * | 9/2003 | Muesch et al. | 700/94 |
| 2006/0204037 | A1 * | 9/2006 | Watanabe et al. | 382/104 |
| 2007/0127879 | A1 * | 6/2007 | Frank et al. | 386/46 |
| 2007/0177744 | A1 * | 8/2007 | Kirn | 381/107 |
| 2008/0137883 | A1 * | 6/2008 | Araki | 381/107 |

(Continued)

*Primary Examiner* — Vivian Chin
*Assistant Examiner* — Leonard M Giannone
(74) *Attorney, Agent, or Firm* — Bacon & Thomas, PLLC

(57) ABSTRACT

An apparatus for detecting the approach distance of a human body and performing different actions according to the detecting results comprises: an infrared sensing circuit for sensing the human body's movement; a short-distance infrared signal level detector, used for detecting the amplitude level of signals and comparing them with a preset reference level; a long-distance infrared signal level detector, used for detecting the amplitude level of signals and comparing them with another preset reference level; and a long-distance indication-signal time delayer, used for delaying the output of the signals from the long-distance-signal level detector. During the delayed period, a soft pre-recorded speech is sent off to greet customers and introduce merchandize when the short-distance-signal level detector detects a "short-distance" signal with larger amplitude, whereas a louder pre-recorded speech is sent off to draw the attention of customers when no "short-distance" signal is detected by the short-distance-signal level detector.

16 Claims, 5 Drawing Sheets

(56) References Cited

U.S. PATENT DOCUMENTS

| | | | |
|---|---|---|---|
| 2009/0102648 A1* | 4/2009 | Lung | 340/541 |
| 2009/0115992 A1* | 5/2009 | Sakai | 356/5.01 |
| 2009/0222116 A1* | 9/2009 | Kang et al. | 700/94 |
| 2010/0274372 A1* | 10/2010 | Nielsen et al. | 700/94 |
| 2011/0150283 A1* | 6/2011 | Kim et al. | 382/103 |
| 2012/0027226 A1* | 2/2012 | Desenberg | 381/105 |
| 2013/0094668 A1* | 4/2013 | Poulsen et al. | 381/107 |

\* cited by examiner

//...

APPARATUS FOR DETECTING THE APPROACH DISTANCE OF A HUMAN BODY AND PERFORMING DIFFERENT ACTIONS ACCORDING TO THE DETECTING RESULTS

TECHNICAL FIELD

The present invention relates to an apparatus and, more particularly, to an apparatus for detecting the approach distance of a human body and performing according to the detecting results different actions, such as changing volume and outputting different audio or video contents, and can be used in houses or public places such as stores, department stores, banks, and government institutions.

BACKGROUND

Currently in the market, recordable infrared sensing visitor chimes and recordable portable speakers are available. When being used in merchandizing, the visitor chimes or portable speakers are only capable of playing loudly and repeatedly the speech sounds with the same contents. For the customers standing far away, these loud speech sounds may more easily be heard. For the customers standing near by the visitor chimes and portable speakers, however, these high-decibel speech sounds are becoming noisy and oppressing and even may invoke adverse sentiments from customers. Consequently, not only does the business promotion goal fails to achieve, but it also may produce adverse effects.

In order to overcome above shortcomings, inventor had the motive to study and develop the present invention. After hard research and development, the inventor provides an apparatus for detecting the approach distance of a human body and performing different actions according to the detecting results.

SUMMARY OF THE DISCLOSURE

An object of the present invention is to provide an apparatus capable of outputting different audio and video contents according to the results of detecting the approach distance of a human body, so as to make more effective the sales and business promotion.

Another object of the present invention is to provide an apparatus capable of changing the volume according to the results of detecting the approach distance of a human body, so as to make more effective the sales and business promotion.

In order to achieve above objects, the present invention comprises a pyroelectric infrared sensor, an infrared signal amplifier for detecting the infrared signals of a human body, and infrared long-distance and short-distance signal level detectors together with a long-distance indication-signal time delayer for determining the distance of the human body from the present device, that is, the apparatus.

In practice, the present invention further comprises an auto-attenuation volume control circuit. The auto-attenuation volume control circuit is electrically connected with the short-distance infrared signal level detector and the audio-frequency power amplifier, so as to attenuate the output audio signals from the audio-frequency power amplifier when the human body is in a short distance.

The main characteristic of the present invention is that the distance of a human body from the infrared sensor can be detected when the human body enters into the detection range of the pyroelectric infrared sensor. For example, the "short distance" can be defined as within the range of 0~3 meters, whereas the "long distance" can be defined as within the range of 3~8 meters. The range of short distance or long distance can be adjusted as needed and is used as a judgment for performing different actions. In other words, according to the present invention, by detecting the distance of a human body from the infrared sensor, different actions can be performed according to the detected results. The principle is as following: FIG. 3 shows that an adult is demonstrated to move in front of the pyroelectric infrared sensor in the same direction and with constant speed. When the human body is at a location far away from the infrared sensor, the signal amplitude level is measured via the output end of the infrared signal amplifier. FIG. 4 shows that the human body is getting nearer to the infrared sensor. When the human body is at a location nearer to the infrared sensor, the signal amplitude level is measured via the output end of the infrared signal amplifier, where the nearer the human body approaches the infrared sensor, the higher the signal amplitude level is. Moreover, when the human body is in a long distance from the infrared sensor, "t1" denotes the time required for the detected signal amplitude to ascend to the datum point (point A) of the "long-distance" level that is preset by the signal level detector. When the human body is in a short distance from the infrared sensor, "t2" denotes the time required for the detected signal amplitude to ascend to the datum point (point B) of the "short-distance" level that is preset by the signal level detector, where "t2" is longer than "t1". As shown in FIG. 5, the time difference "t3" can be expressed as the formula $t3=t2-t1$. According to the present invention, when the human body is getting nearer to the infrared sensor, longer time is required for the detected signal amplitude to ascend to the datum point (point B) of the "short-distance" level that is preset by the signal level detector. Consequently, when a "long-distance" signal with lower signal amplitude level is detected by the infrared signal level detector of the present invention, the signal from the output end of the "long-distance signal level detector" should be delayed for a period of time (>t3) by a long-distance indication-signal time delayer before being output. During this delayed period of time, if a "short-distance" signal with higher amplitude is detected by the short-distance signal level detector and a "short-distance indication signal" is output from the output end thereof, it shows that a human body appears within the short-distance range of the present device. In this case, the present device will perform the actions that should be performed when the detecting result shows that a human body is within the short-distance range of the present device. During the specific delayed time period of the long-distance indication signal, if there is no "short-distance indication signal" from the output end of the short-distance signal level detector, it shows that the human body is within the "long-distance" range of the present device. Accordingly, the present invention will perform the actions that should be performed when the detecting result shows that a human body is within the long-distance range of the present device. Thereby, the difference between the two characteristics, that is, the "degree of the signal amplitude" and "the rise time required for the signal level to ascend to preset datum point", can be used as a criterion for determining the distance of a human body from the infrared sensor.

The method for detecting the distance of a human body from the infrared sensor is the critical technique of the present invention. Based on the same principle and technique, present device can be adapted to include the function to detect two or more distance ranges (such as the long/middle/short distance ranges) of a human body from the infrared sensor and perform different actions corresponding to different detecting results. Moreover, the audio recording/playing integrated circuit (IC) of the present device can pre-record multiple sections of sounds with different contents. Thereby, the sounds with different contents can be played corresponding to the results of detecting the distance of the human body from the present device.

Furthermore, the present invention further comprises a set of monostable multivibrator for controlling the volume automatically. When the audio recording/playing IC is playing the pre-recorded audio contents corresponding to the "short-distance" state, this circuit will send a control signal in order to lower the output volume of the audio-frequency power amplifier, so as to make the present device a humane design to assure that those who stand near by the present device will not be annoyed by the high volume of the speech sounds. Furthermore, the present invention further comprises a set of astable multivibrator used for automatically triggering the audio recording/playing IC to play pre-recorded sounds at intervals. The length of an interval can be preset by users. By controlling the power and function switches according to the present invention, it can be determined whether the present device should automatically play the sounds pre-recorded by the audio recording/playing IC at intervals even if there is no human body approaching, so that the customers' attention can be attracted and merchandize can be promoted in the absence of service personnel.

The following detailed description, given by way of examples or embodiments, will best be understood in conjunction with the accompanying drawings.

DETAILED DESCRIPTION

Figure 1:
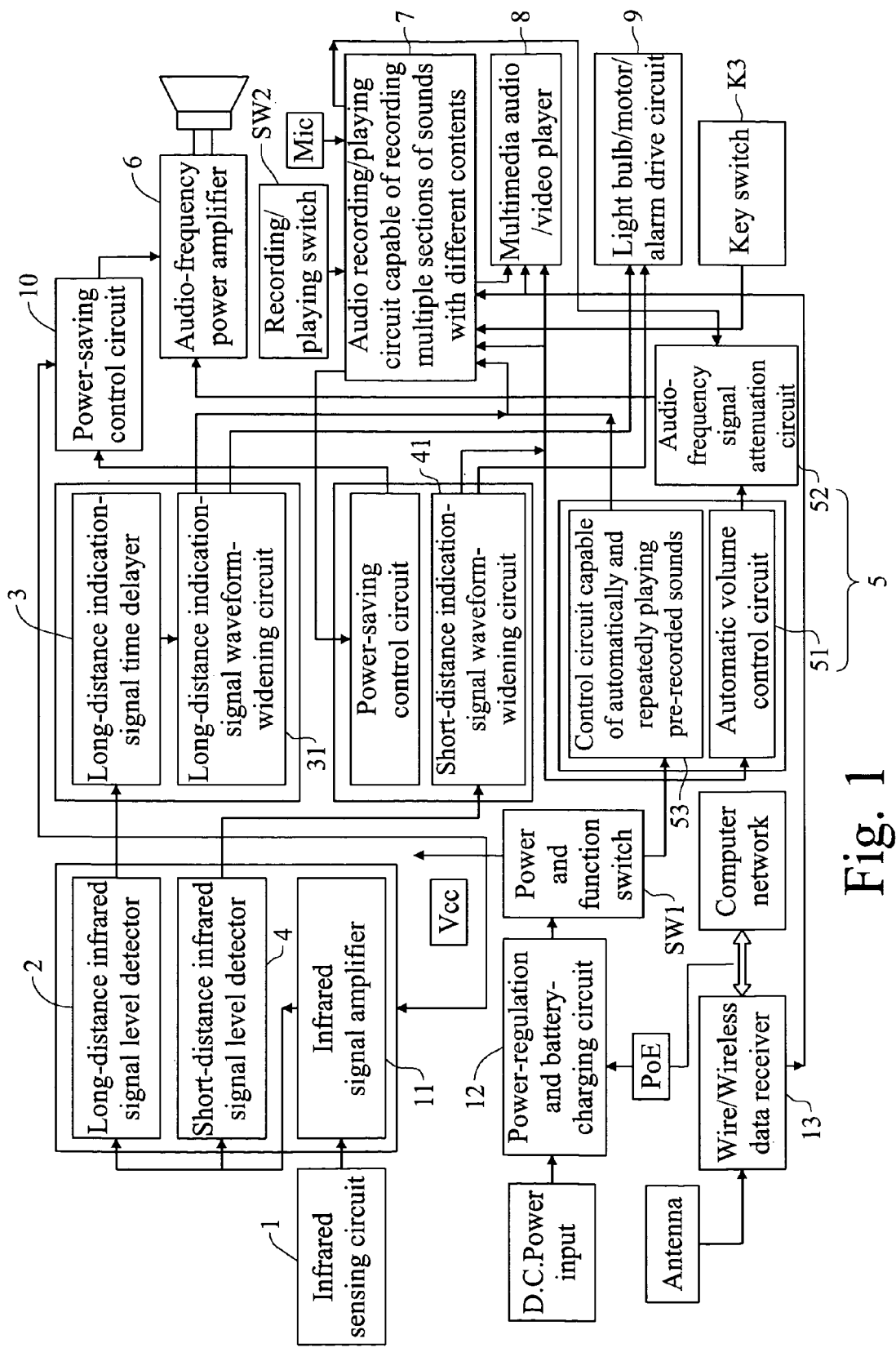
FIG. 1 is a circuit block diagram of a preferred embodiment of the present invention.

Please refer to FIG. 1, which shows a circuit block diagram of a preferred embodiment of an apparatus for detecting the approach distance of a human body and performing different actions according to the detecting results. The apparatus comprises an infrared sensing circuit 1, a long-distance infrared signal level detector 2, a long-distance indication-signal time delayer 3, a long-distance indication-signal waveform-widening circuit 31, a short-distance infrared signal level detector 4, a short-distance indication-signal waveform-widening circuit 41, and an auto-attenuation volume control circuit 5.

The infrared sensing circuit 1 is provided for sensing the movement of a human body and outputting signals via an output end of an infrared signal amplifier 11. The long-distance infrared signal level detector 2 is electrically connected to the output end of the infrared signal amplifier 11 and is used for detecting the amplitude level of the output signals from the output end and for comparing them with a preset reference level. The long-distance indication-signal waveform-widening circuit 31 is electrically connected with the long-distance indication-signal time delayer 3 and is used for widening the output waveforms from the long-distance indication-signal time delayer. By this way, audio signals can be output by an audio recording/playing circuit 7 and an audio-frequency power amplifier 6 when a human body is in the long distance. The long-distance indication-signal time delayer 3 is electrically connected to the long-distance infrared signal level detector 2 and is used for delaying the output signals from the long-distance infrared signal level detector 2. The short-distance infrared signal level detector 4 is electrically connected to the output end of the infrared signal amplifier 11 and is used for detecting the amplitude level of output signals from the output end and comparing them with a preset reference level. The short-distance indication-signal waveform-widening circuit 41 is electrically connected with short-distance infrared signal level detector 4 and is used for widening the output waveforms from short-distance infrared signal level detector 4. By this way, audio signals can be output by the audio recording/playing circuit 7 and the audio-frequency power amplifier 6 when a human body is in the short distance. The auto-attenuation volume control circuit 5 is electrically connected with the audio-frequency power amplifier 6 and connected with the short-distance infrared signal level detector 4 via the short-distance indication-signal waveform-widening circuit 41, so as to attenuate the output audio signals from the audio-frequency power amplifier 6.

Figure 2A:
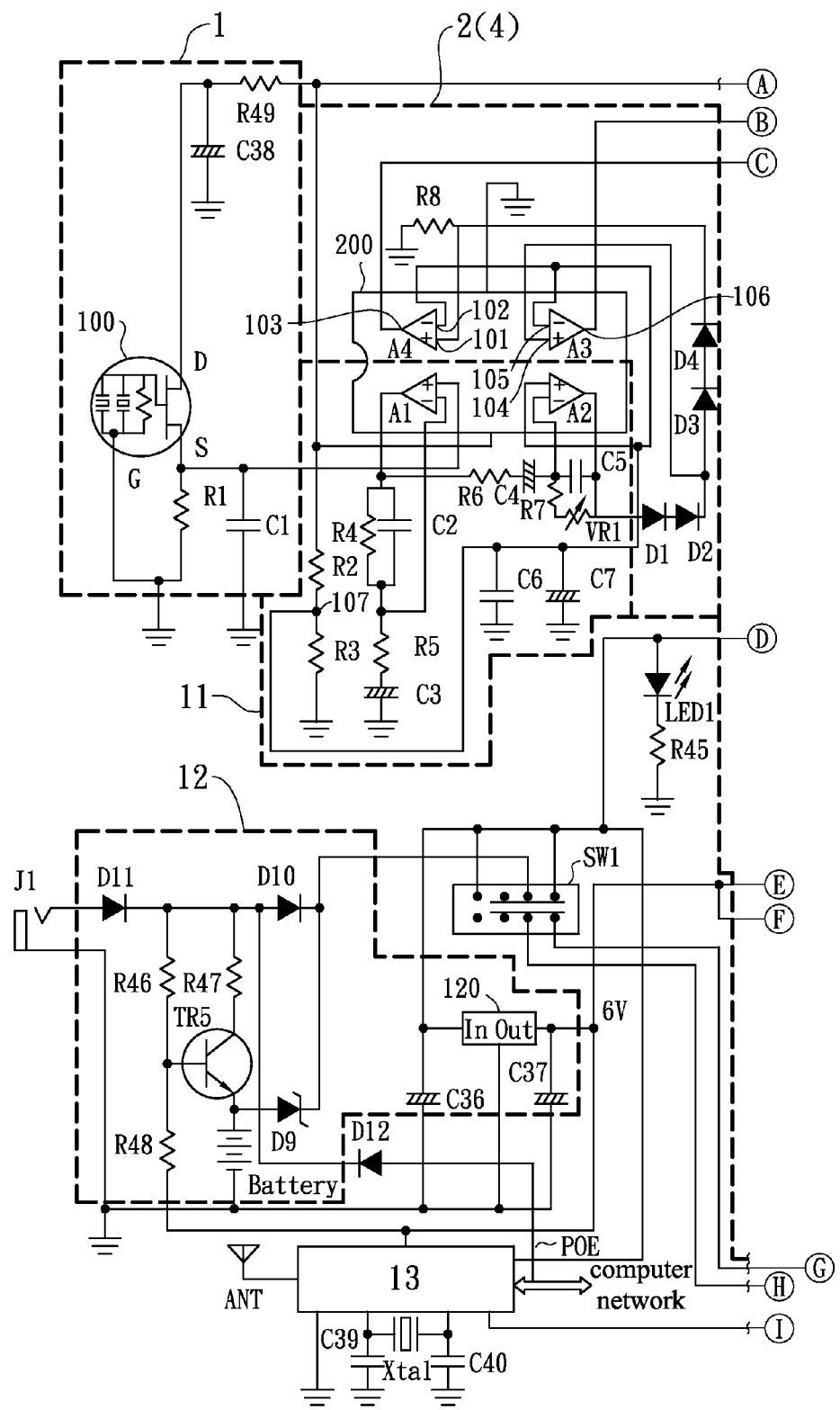
FIGS. 2A~2C are circuit diagrams of the preferred embodiment of the present invention.
Figure 2B:
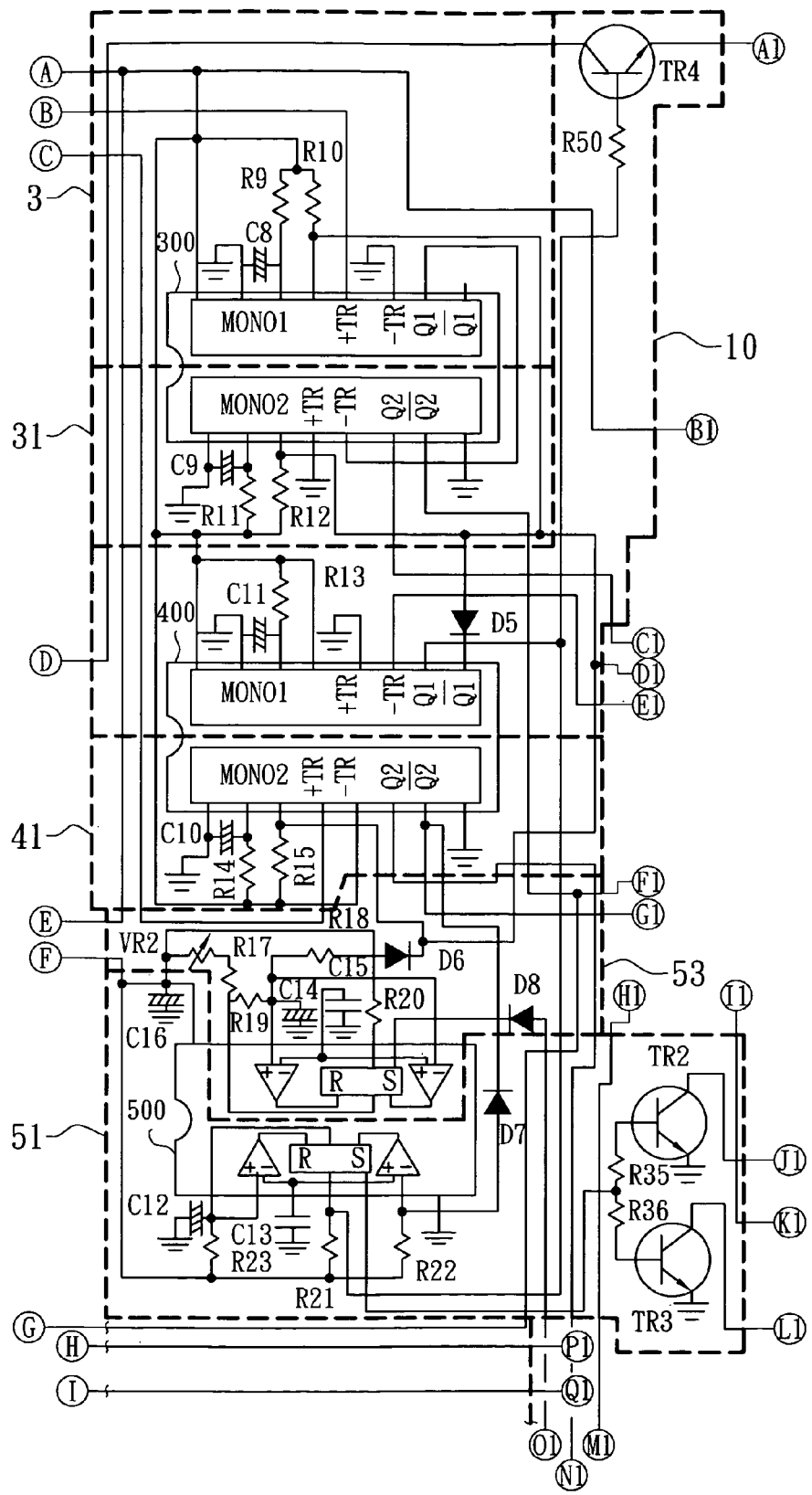
Figure 2C:
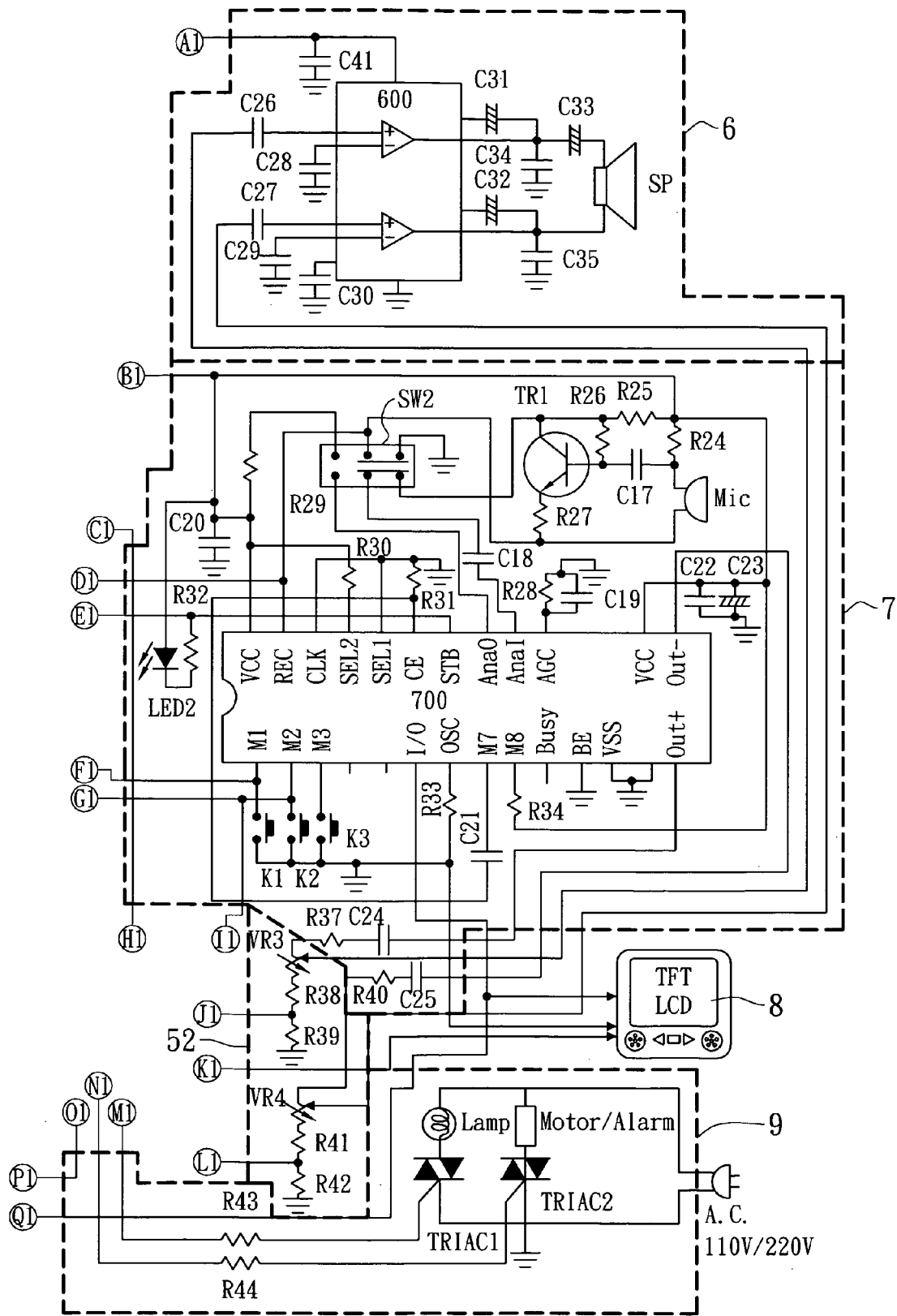
Figure 3:
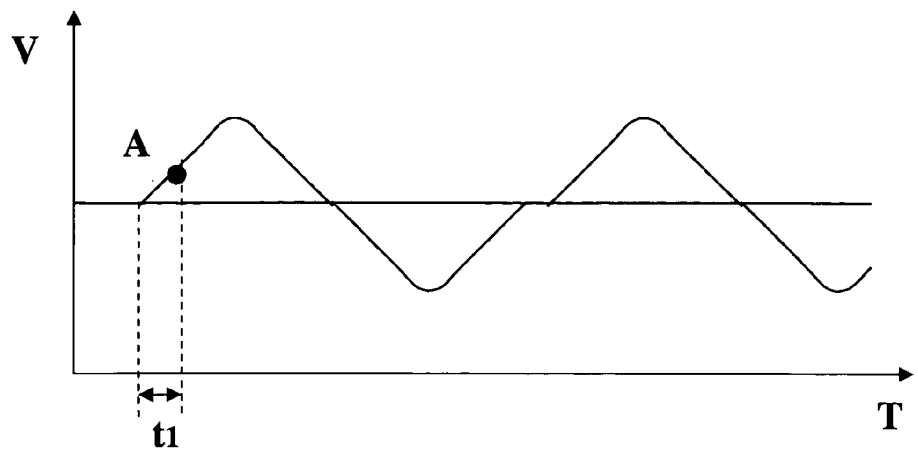
FIG. 3 shows the waveform of the signal produced when a human body is in a long distance from the infrared sensor.
Figure 4:
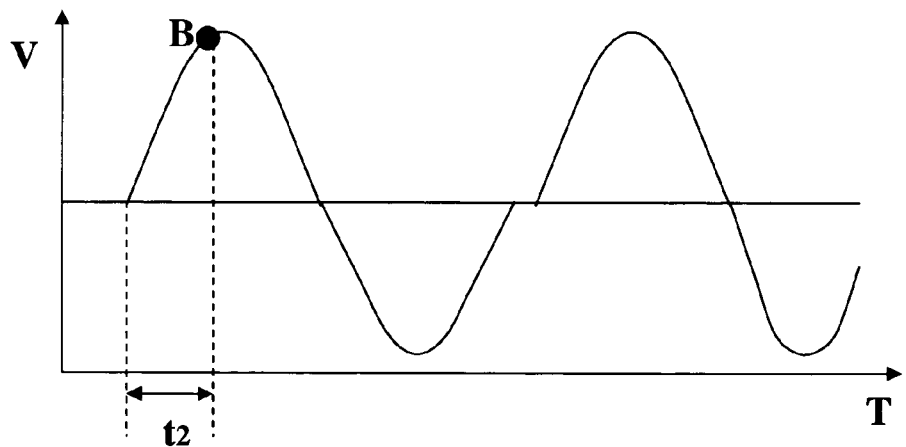
FIG. 4 shows the waveform of the signal produced when a human body is in a short distance from the infrared sensor.
Figure 5:
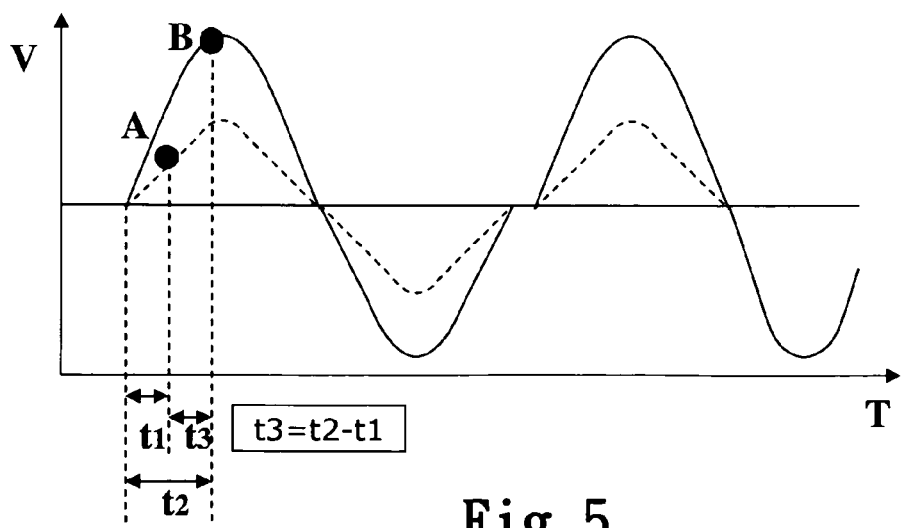
FIG. 5 shows the difference of the times respectively required for the long-distance and short-distance signals to ascend to the datum points of preset levels.

Please refer to FIG. 2 of the present utility model, a power-regulation and battery-charging circuit 12 is connected with an external AC-to-DC power supplier or with an encased rechargeable battery for providing electrical power to the circuits of a whole system. The power-regulation and battery-charging circuit 12 comprises a transistor TR5, a voltage-stabilizing integrated circuit 120, diodes D9, D10, D11, resistors R46, R47, R48, and capacitors C36, C37. The human-body infrared sensing circuit 1 comprises an infrared sensor 100, resistors R1, R49, and capacitors C1, C38. The infrared signals detected by the infrared sensing circuit 1 is transmitted to the infrared signal amplifier 11, the long-distance infrared signal level detector 2, and the short-distance infrared signal level detector 4 to be processed further. The infrared signal amplifier 11 comprises amplifiers A1, A2 in an integrated circuit 200 together with resistors R2, R3, R4, R5, R6, R7, variable resistor VR1, and capacitors C2, C3, C4, C5, C6, C7; the resistors R2, R3 are in series with each other for voltage division to form at least one node 107, thereby providing a preset reference level. The long-distance infrared signal level detector 2 comprises an amplifier A3 having three connected points 104, 105, 106 in the integrated circuit 200 together with a resistor R8 and diodes D1, D2, wherein the connected points 104 and 105 are input points, and the connected point 106 is an output point; wherein the diodes D1, D2 are respectively connected with the output end of the infrared signal amplifier 11 and the first connected point 104 (input point) of the amplifier A3 for attenuating input signal from the infrared signal amplifier 11; wherein the diodes D1, D2 are shared with the short-distance infrared signal level detector 4; the second connected point 105 (input point) of the amplifier A3 is electrically connected with the node 107; the amplifier A3 is provided for detecting the level of output signals from the first connected point 104 and comparing them with the preset reference level from the second connected point 105, if the signal level of the first connected point 104 is higher than the preset reference level, then the amplifier A3 will output a long-distance signal level via the third connected point 106 (output point). The short-distance infrared signal level detector 4 comprises an amplifier A4 having three connected points 101, 102, 103 in the integrated circuit 200 together with a resistor R8 and diodes D3, D4; wherein the connected points 101 and 102 are input points, and the connected point 103 is an output point; the plurality of diodes D1, D2, D3, D4 are respectively connected with the output end of the infrared signal amplifier 11 and the first connected point 101 (input point) of the amplifier A4 for attenuating input signal from the infrared signal amplifier 11; the second connected point 102 (input point) of the amplifier A4 is electrically connected with the node 107; the amplifier A4 is provided for detecting the level of output signals from the first connected point 101 and comparing them with the preset reference level from the second connected point 102, if the signal level of the first connected point 101 is higher than the preset reference level, then the amplifier A4 will output a short-distance signal level via the third connected point 103 (output point). The variable resistor VR1 is used to adjust the sensibility of the infrared detection.

After the signals of the long-distance infrared signal level detector 2 are transmitted to the long-distance indication-signal time delayer 3, the output waveforms thereof are widened via the long-distance indication-signal waveform-widening circuit 31. The long-distance indication-signal time delayer 3 comprises one set of monostable multivibrator MONO1 in an integrated circuit 300, resistors R9, R10, and a capacitor C8. The long-distance indication-signal waveform-widening circuit 31 comprises another set of monostable multivibrator MONO2 in the integrated circuit 300, resistors R11, R12, and a capacitor C9. The signals of the short-distance infrared signal level detector 4 are transmitted to the short-distance indication-signal waveform-widening circuit 41 for widening the waveforms thereof. The short-distance indication-signal waveform-widening circuit 41 comprises one set of monostable multivibrator MONO2 in an integrated circuit 400 together with resistors R14, R15, and a capacitor C10.

During the predetermined delayed time period of long-distance indication signals, the detection of short-distance indication signals implies that the human body is in the short distance. During this period of time, if the long-distance indication signals are present while the short-distance indication signals are absent, it indicates that the human body is in the long distance. Thereby, the pre-recorded sounds with different volumes and various contents can be output according to the results of detecting the distance of the human body from the present device.

In practice, an audio recording/playing circuit 7 is electrically connected with the audio-frequency power amplifier 6 and it is capable of recording multiple sections of sounds with different contents and of playing the sections of sounds respectively. The audio recording/playing circuit 7 comprises an integrated circuit 700, a microphone Mic, a transistor TR1, a recording/playing switch SW2, key switches K1, K2, K3, resistors R24, R25, R26, R27, R28, R29, R30, R31, R32, R33, R34, R37, R40, capacitors C17, C18, C19, C20, C21, C22, C23, C24, C25, and a recording/playing indication light LED2. Sounds with different contents will be played according to the long-distance or short-distance judging signals detected and provided by above circuit. By the use of the recording/playing switch SW2 together with the key switches K1, K2, various actions can be performed to record or play sounds with different contents. When the key switch K3 is pushed, the pre-recorded sounds can be output via the audio-frequency power amplifier 6 to call service personnel. In practice, the key switches K1, K2 can be operated manually to output sounds. In other words, a first section of the pre-recorded sounds can be played by pushing the key switch K1 and a second section of the pre-recorded sounds can be played by pushing the key switch K2.

The audio-frequency power amplifier 6 comprises an integrated circuit 600, a speaker SP, capacitors C26, C27, C28, C29, C30, C31, C32, C33, C34, C35, C41 and is used for amplifying and then outputting the audio signals from the audio recording/playing circuit 7. Moreover, the short-distance indication-signal waveform-widening circuit 41 is electrically connected with a multimedia audio/video player 8. When the present device detects that the human body is in the short distance from the present device, it will drives the multimedia audio/video player 8 to play pre-stored audio and video contents.

An integrated circuit 500 is provided with two sets of timers therein. One set of timer together with transistors TR2, TR3, a diode D7, resistors R21, R22, R23, R35, R36, and capacitors C12, C13, C16 constitute an automatic volume control circuit 51. Variable resistors VR3, VR4, and resistors R38, R39, R41, R42 together constitute an audio-frequency signal attenuation circuit 52. The detection of the short-distance indication signals will trigger the automatic volume control circuit 51. After that, the volume of the audio signals is decreased via the audio-frequency signal attenuation circuit 52. The automatic volume control circuit 51 and the audio-frequency signal attenuation circuit 52 form an auto-attenuation volume control circuit 5. Therefore, when a human body is in the short distance from the present device, the audio signals from the audio recording/playing IC will be attenuated and then played via the speaker of the audio-frequency power amplifier 6 in appropriate volume. Consequently, for the persons in the short distance from the present device, the sounds will not be so noisy. Another set of timer together with diodes D6, D8, a variable resistor VR2, resistors R17, R18, R19, R20, and capacitors C14, C15 constitute a control circuit 53 capable of playing the pre-recorded sounds repeatedly. Therefore, when there is no person approaching the present device, the pre-recorded sounds can be played repeatedly at intervals and the internal time is preset by the variable resistor VR2. In practice, under the control of the power and function switch SW1 that is connected with the control circuit 53 capable of playing repeatedly the pre-recorded sounds, it is free for users to determine whether or not to play automatically and repeatedly the sounds pre-recorded by the recording/playing IC 700 at intervals in a condition where no person approaches the present device.

Moreover, the present invention also comprises a power-saving control circuit 10 including one set of monostable multivibrator MONO1 in an integrated circuit 400, a transistor TR4, resistors R13, R50, a capacitor C11, and a diode D5. In this case, the integrated circuit 400 will send "Low" signals under the condition that no pre-recorded contents are played, so as to disconnect the transistor TR4 and then, stop the current supplying to the audio-frequency power amplifier 6. Consequently, it is not only power saving but also able to prolong the battery life.

Moreover, the waveforms of the long-distance and short-distance indication signals respectively detected by the long-distance infrared signal level detector 2 and short-distance infrared signal level detector 4 can be widened respectively by the long-distance indication-signal waveform-widening circuit 31 and the short-distance indication-signal waveform-widening circuit 41. After that, a drive circuit for light bulb/motor/alarm 9 comprising resistors R43, R44, and bi-directional triode thyristors TRIAC1, TRIAC2 can be driven to actuate light bulbs, motors, or alarms. Accordingly, a multi-level protection scheme can be achieved.

In practice, the present invention further comprises a wired/wireless data receiver 13. The wired/wireless data receiver 13 is electrically connected respectively with a remote host computer, the power-regulation and battery-charging circuit 12, the audio recording/playing circuit 7, and the multimedia audio/video player 8. Consequently, the contents pre-stored in the audio recording/playing IC 700 and the multimedia audio/video player 8 can be updated after being connected with the remote host computer via radio waves or wired communication network. Moreover, the electrical power required for the operation of the circuits in the present invention can be provided via a diode D12 from the Power over Ethernet (PoE) in the network.

As mentioned above, the present device is capable of detecting the distance of a human body and thus can be used in multi-functional merchandize promotion devices and devices regarding safety reminder in public places, travel guidance, business promotion, and security protection systems and robots. These devices can perform different actions corresponding to the results of detecting the distance of a human body from the present device.

Therefore, the present invention has following advantages:

1. According to the present invention, different pre-determined actions can be performed corresponding to the results of detecting the distance of a human body from the infrared sensor. When customers move within the "long-distance" range of the present device, the first section of the pre-recorded sounds of merchandize promotion can be played loudly in order to draw the attention of these customers. When the customers move within the "short-distance" range of the present device, the second section of the pre-recorded sounds of friendly greeting and commodity introduction can be played in lower or appropriate volume. Thereby, it is able to draw the customers' attention and promote merchandize in the absence of service personnel and in a friendlier way instead of evoking the sense of oppression from the customers.
2. Based on the same principle and technique, the device of the present invention can be adapted to include the function of detecting two or more distance ranges (such as long/middle/short distance ranges) of a human body from the infrared sensor. In practice, it also can be elastically applied to multiple distance ranges in order to perform multiple actions corresponding to different detecting results.
3. According to the present invention, based on the results of detecting the distance of a human body from the infrared sensor, it is able to play correspondingly different video and sounds or to drive light bulbs, alarms, and other electrically-operated devices which are under the control of motors/relays. Thereby, the present invention is suitable for public places such as stores, hypermarkets, and banks, and safeguard systems.
4. According to the present invention, sounds of vehicle horn, rings, or other sounds can be pre-recorded. These sounds can be output in an automatically or manually triggered manner to alert forward vehicle/personnel or to give off speech sounds for making a give-way request. Thereby, it is suitable for various kinds of vehicles and passengers.
5. When the present invention is used in a device for the purpose of merchandize promotion, it is very convenient to operate. By pushing a key switch, the pre-recorded audio signals can be output to call the service personnel in hypermarkets or other public places to provide services.
6. According to the present invention, the circuit where higher current flowing through will be cut off automatically when no pre-recorded contents are played. Thereby, it is beneficial to the environmental protection, carbon reduction, and energy saving.

As disclosed in above descriptions and attached drawings, the present invention can achieve desired objectives. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. An apparatus for detecting the approach distance of a human body and performing different actions according to the detecting results, comprising:

an infrared sensing circuit, configured as a pyroelectric infrared sensor for sensing the human body's movement and outputting signals via an output end of an infrared signal amplifier; the infrared signal amplifier including plurality of resistors, wherein the plurality of resistors are in series with each other for voltage division to form at least one node, thereby providing a preset reference level; and a variable resistor connected with the infrared signal amplifier for adjusting the gain amplitude of the infrared signal amplifier and output signal;

a short-distance infrared signal level detector including a plurality of diodes and an amplifier having three connected points; the plurality of diodes, respectively connected with the output end of the infrared signal amplifier and the first connected point of the amplifier, for attenuating input signal from the infrared signal amplifier; the second connected point of the amplifier being electrically connected with the node; wherein the amplifier is provided for detecting the level of output signals from the first connected point and comparing them with the preset reference level from the second connected point, such that if the signal level of the first connected point is higher than the preset reference level, then the amplifier will output a short-distance signal level via the third connected point;

a long-distance infrared signal level detector including a plurality of diodes and an amplifier having three connected points; the plurality of diodes, respectively connected with the output end of the infrared signal amplifier and the first connected point of the amplifier, for attenuating input signal from the infrared signal amplifier, wherein the number of the diodes of the long-distance infrared signal level detector is less than that of the short-distance infrared signal level detector; the second connected point of the amplifier is electrically connected with the node; wherein the amplifier is provided for detecting the level of output signals from the first connected point and comparing them with the preset reference level from the second connected point such that if the signal level of the first connected point is higher than the preset reference level then the amplifier will output a long-distance signal level via the third connected point;

a long-distance indication-signal time delayer, electrically connected to the long-distance infrared signal level detector, provided for delaying the output of the signals from the long-distance infrared signal level detector; wherein when a long-distance signal is detected by the long-distance infrared signal level detector, the signal from the output end of the long-distance signal level detector should be delayed for a period of time, wherein if the short-distance infrared signal level detector detects the short-distance signal level during the delayed time, an audio-frequency power amplifier outputs short-distance audio signals when the human is in a short distance from the apparatus; and wherein if the short-distance infrared signal level detector does not detect the short-distance signal level during the delayed time, an audio-frequency power amplifier outputs long-distance audio signals when the human is in a long distance from the apparatus when the delayed time is ended.

2. The apparatus as claimed in claim 1, further comprising an auto-attenuation volume control circuit, wherein the auto-attenuation volume control circuit is electrically connected with the short-distance infrared signal level detector and the audio-frequency power amplifier, so as to attenuate the output audio signals from the audio-frequency power amplifier when the human body is in a short distance from the apparatus.

3. The apparatus as claimed in claim 1, further comprising a long-distance indication-signal waveform-widening circuit, wherein the long-distance indication-signal waveform-widening circuit is electrically connected with the long-distance indication-signal time delayer and is provided for widening the output waveforms from the long-distance indication-signal time delayer.

4. The apparatus as claimed in claim 3, further comprising a short-distance indication-signal waveform-widening circuit, wherein the short-distance indication-signal waveform-widening circuit is electrically connected with short-distance infrared signal level detector and is provided for widening the output waveforms from the short-distance infrared signal level detector.

5. The apparatus as claimed in claim 4, further comprising a light bulb/motor/alarm drive circuit for light bulb/motor/alarm; the drive circuit electrically connected to the short-distance indication-signal waveform-widening circuit and the long-distance indication-signal waveform-widening circuit respectively and is provided for actuating light bulbs, alarms, and electrically operated facilities which are controlled by motors.

6. The apparatus as claimed in claim 4, further comprising a multimedia audio/video player, wherein the multimedia audio/video player is electrically connected with the short-distance indication-signal waveform-widening circuit.

7. The apparatus as claimed in claim 6, further comprising an audio recording/playing circuit, wherein the audio recording/playing circuit is electrically connected with the audio-frequency power amplifier, so as to output sounds with various contents.

8. The apparatus as claimed in claim 7, wherein the audio recording/playing circuit is provided with at least one manually triggered button switch manually operated for giving off pre-recorded sounds of vehicle horn, rings, or other sounds for alerting forward vehicle/personnel or to give off speech sounds to make a give-way request.

9. The apparatus as claimed in claim 7, further comprising a power-regulation and battery-charging circuit, connected with an external AC-to-DC power supplier or an encased rechargeable battery for providing electrical power to the circuits of a whole system.

10. The apparatus as claimed in claim 9, further comprising a wired/wireless data receiver, where the wired/wireless data receiver is electrically connected respectively with a remote host computer, the power-regulation and battery-charging circuit, the audio recording/playing circuit, and the multimedia audio/video player, so as to provide electrical power to the power-regulation and battery-charging circuit and to update the audio/video contents for the audio recording/playing circuit and multimedia audio/video player.

11. The apparatus as claimed in claim 7 further comprising a control circuit electronically connected with the audio recording/playing circuit, wherein the control circuit is used for automatically and repeatedly playing pre-recorded sounds at preset intervals even if there is no human body approaching.

12. The apparatus as claimed in claim 1 further comprising an audio recording/playing circuit, wherein the audio recording/playing circuit is electrically connected with the audio-frequency power amplifier, so as to output sounds with various contents.

13. The apparatus as claimed in claim 12, wherein the audio recording/playing circuit is provided with at least one manually triggered button switch manually operated for giving off pre-recorded sounds of vehicle horn or rings or other sounds for alerting forward vehicle/personnel or to give off speech sounds to make a give-way request.

14. The apparatus as claimed in claim 12 further comprising a power-regulation and battery-charging circuit, connected with an external AC-to-DC power supplier or an encased rechargeable battery for providing electrical power to the circuits of a whole system.

15. The apparatus as claimed in claim 14 further comprising a wired/wireless data receiver, where the wired/wireless data receiver is electrically connected respectively with a remote host computer, the power-regulation and battery-charging circuit, the audio recording/playing circuit, and a multimedia audio/video player, so as to provide electrical power to the power-regulation and battery-charging circuit and to update the audio/video contents for the audio recording/playing circuit and the multimedia audio/video player.

16. The apparatus as claimed in claim 12 further comprising a control circuit electronically connected with the audio recording/playing circuit, wherein the control circuit is used for automatically and repeatedly playing pre-recorded sounds at preset intervals even if there is no human body approaching.

\* \* \* \* \*